(12) United States Patent
Chu et al.

(10) Patent No.: US 10,614,877 B1
(45) Date of Patent: Apr. 7, 2020

(54) 4T STATIC RANDOM ACCESS MEMORY BITCELL RETENTION

(71) Applicant: INTERNATIONAL BUSINESS MACHINES CORPORATION, Armonk, NY (US)

(72) Inventors: Albert Chu, Nashua, NH (US); Myung-Hee Na, Lagrangeville, NY (US); Robert Wong, Poughkeepsie, NY (US); Sean Burns, Hopewell Junction, NY (US); Jens Haetty, Lagrangeville, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/244,239

(22) Filed: Jan. 10, 2019

(51) Int. Cl.
*G11C 11/412* (2006.01)
*G11C 11/419* (2006.01)

(52) U.S. Cl.
CPC .......... *G11C 11/412* (2013.01); *G11C 11/419* (2013.01)

(58) Field of Classification Search
CPC ............................ G11C 11/419; G11C 11/412
USPC ........................................................ 365/156
See application file for complete search history.

(56) References Cited

U.S. PATENT DOCUMENTS

| 5,020,028 | A | 5/1991 | Wanlass |
| 6,535,445 | B1 | 3/2003 | Lutley |
| 6,731,533 | B2 | 5/2004 | Deng |
| 7,643,329 | B2 * | 1/2010 | Sachdev ............... G11C 11/412 365/154 |
| 8,363,453 | B2 | 1/2013 | Arsovski |
| 8,576,653 | B2 | 11/2013 | Lin |
| 9,978,447 | B2 | 5/2018 | Wang |
| 2016/0093364 | A1 | 3/2016 | Jung |
| 2017/0263308 | A1 | 9/2017 | Gupta |

OTHER PUBLICATIONS

Boumchedda et al., "High-Density 4T SRAM Bitcell in 14-nm 3-D CoolCube Technology Exploiting Assist Techniques," IEEE Transactions on Very Large Scale Integration (VLSI) Systems. vol. 25, Issue: 8. Aug. 2017. pp. 2296-2306.
International Business Machines Corporation, "Bit Line Charge Up Circuit for Loadless Four-Transistor SRAM," IP.com (IPCOM000013763D). Apr. 11, 2002. 5 pages.

* cited by examiner

*Primary Examiner* — Xiaochun L Chen
(74) *Attorney, Agent, or Firm* — Cantor Colburn LLP; Vazken Alexanian

(57) ABSTRACT

A technique relates to a circuit. At least one 4 transistor (4T) static random access memory (SRAM) bitcell is included. Each of the 4T SRAM bitcells includes a first PFET, a first NFET, a second PFET, and a second NFET, the first PFET and the first NFET being coupled to form a first output node, and the second PFET and the second NFET being coupled to form a second output node. A pulldown circuit is coupled to the first NFET, the pulldown circuit operable to pull down a voltage at the first output node. A feedback circuit is operable to monitor the first output node, the feedback circuit operable to control the pulldown circuit.

20 Claims, 14 Drawing Sheets

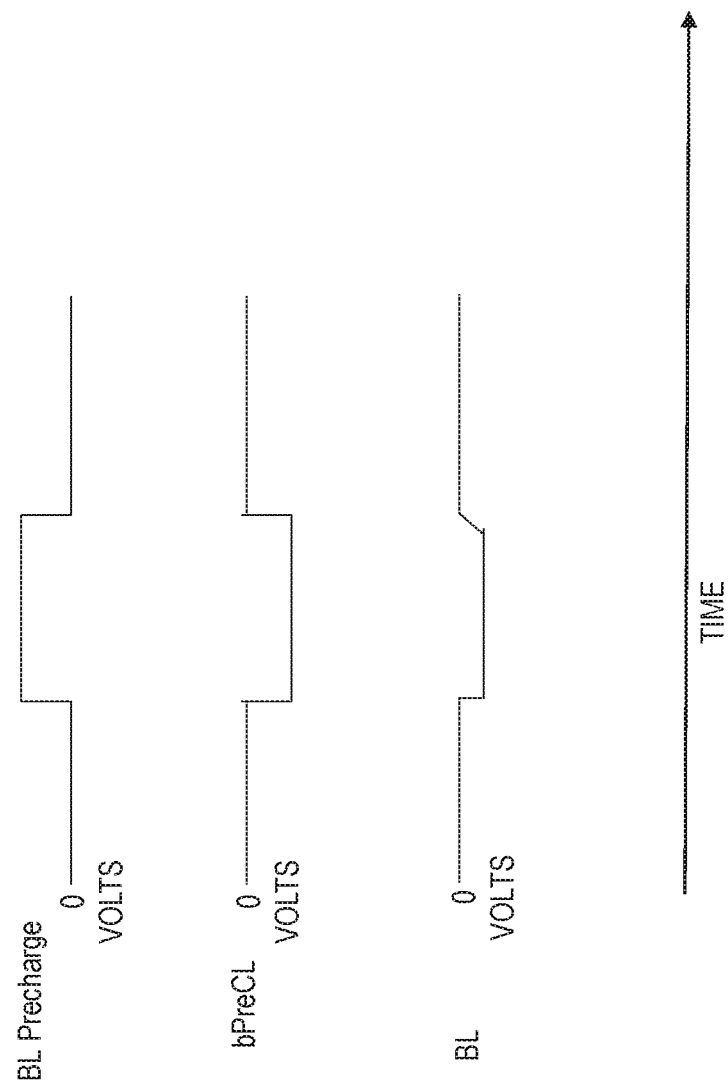

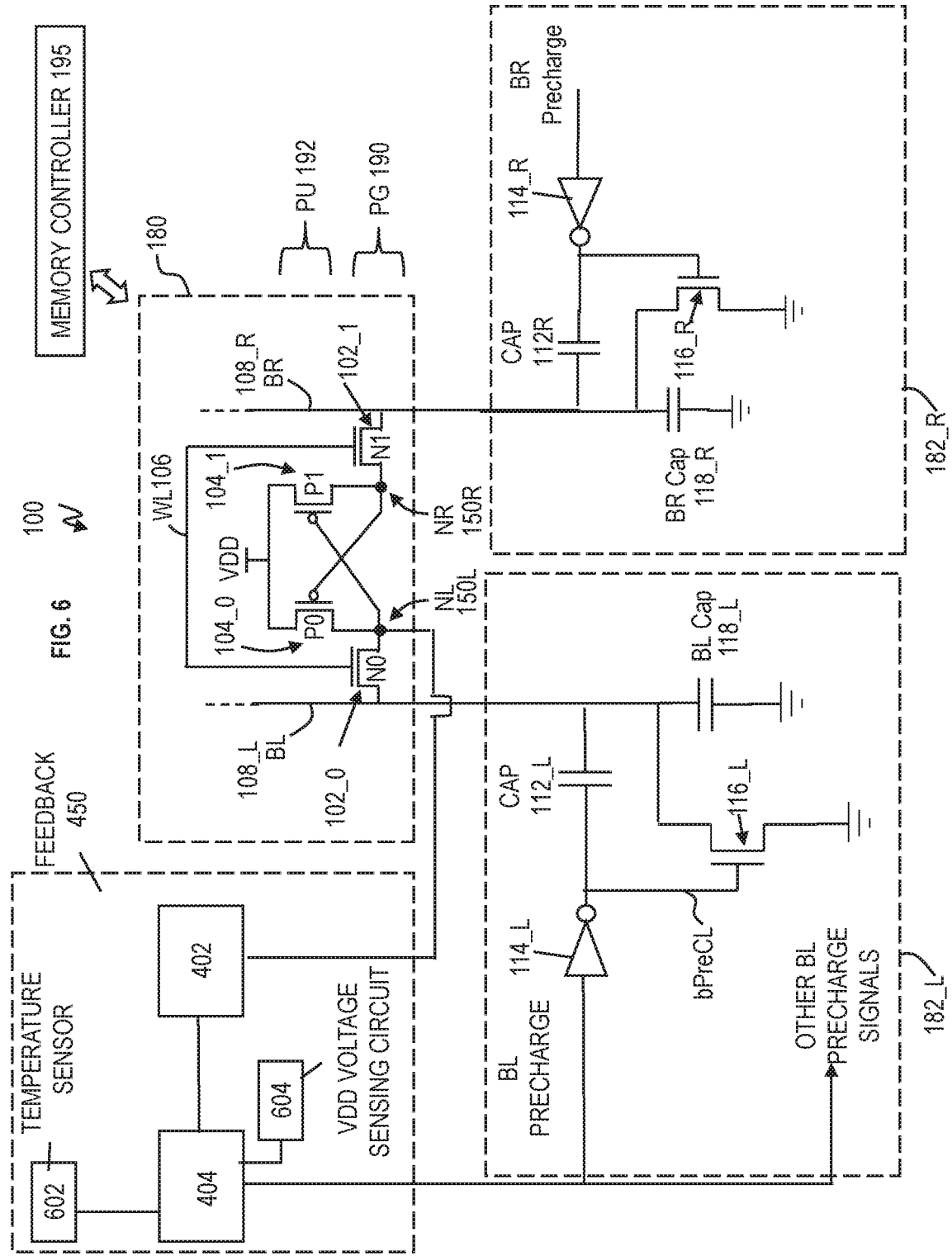

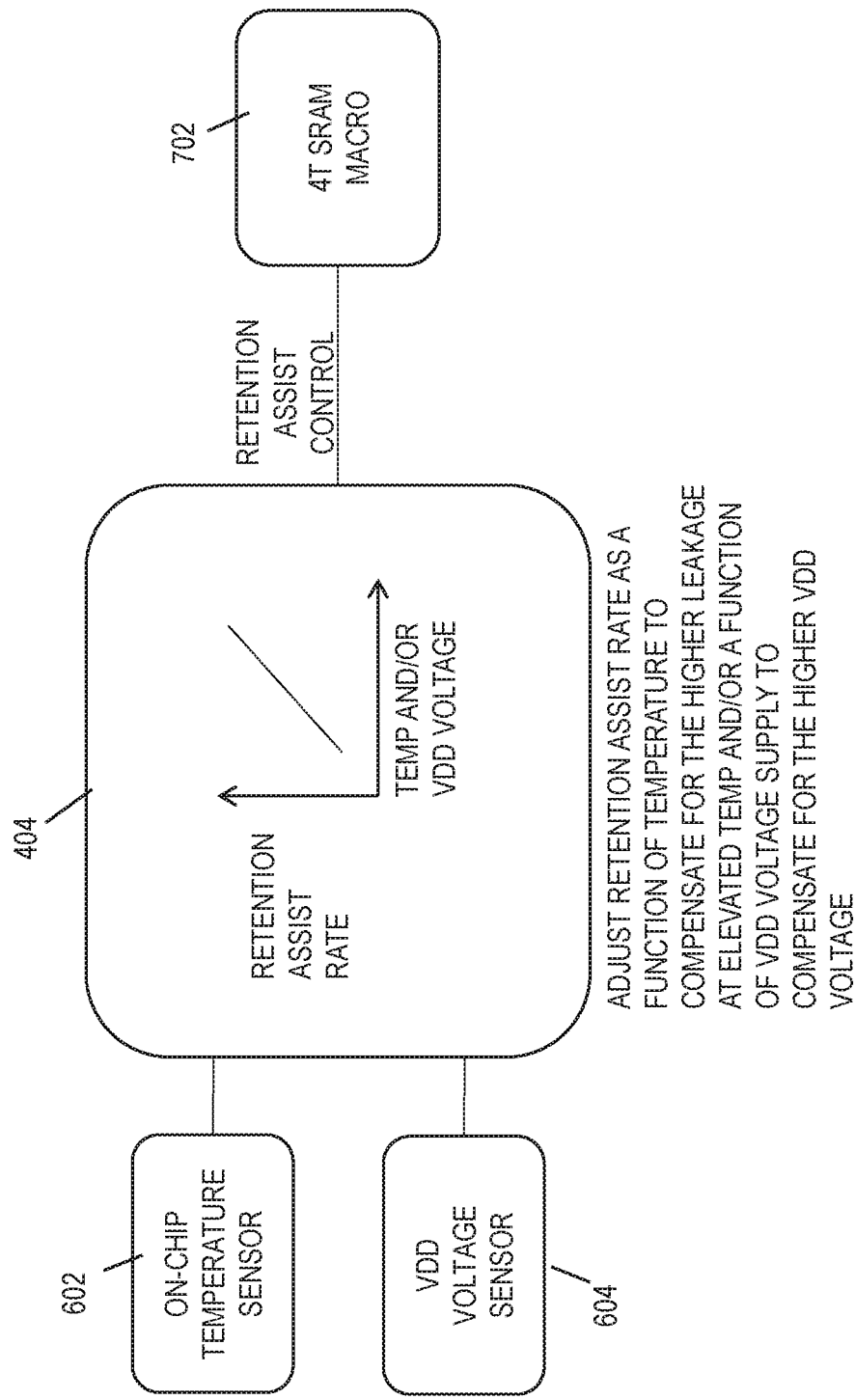

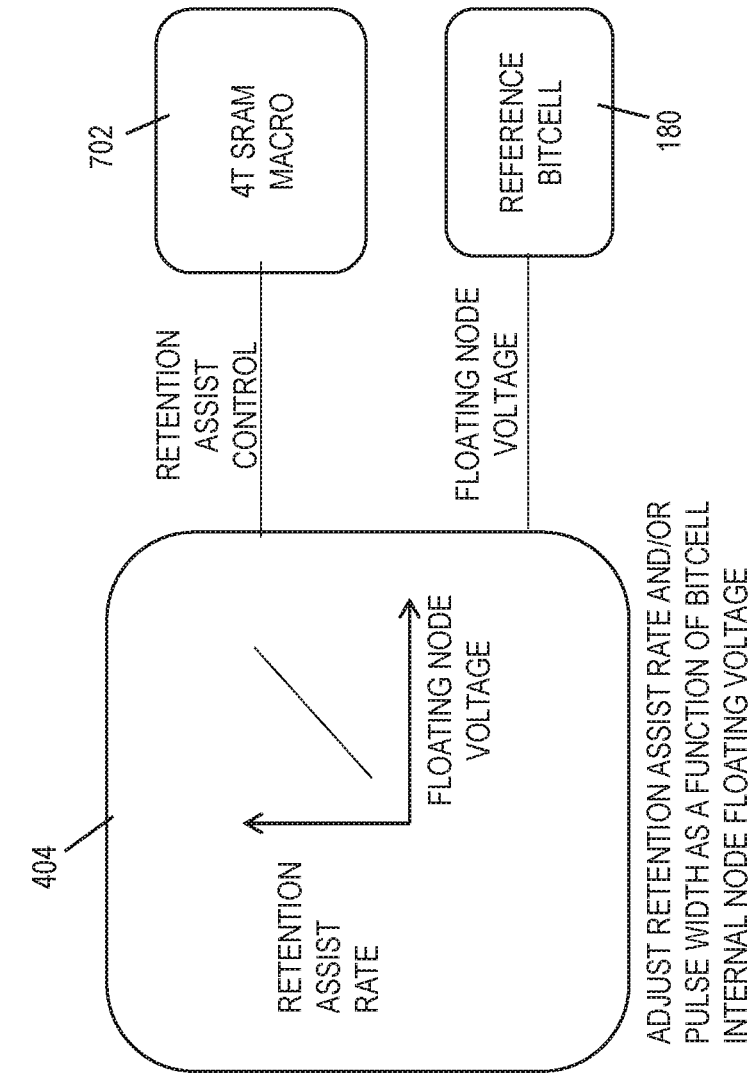

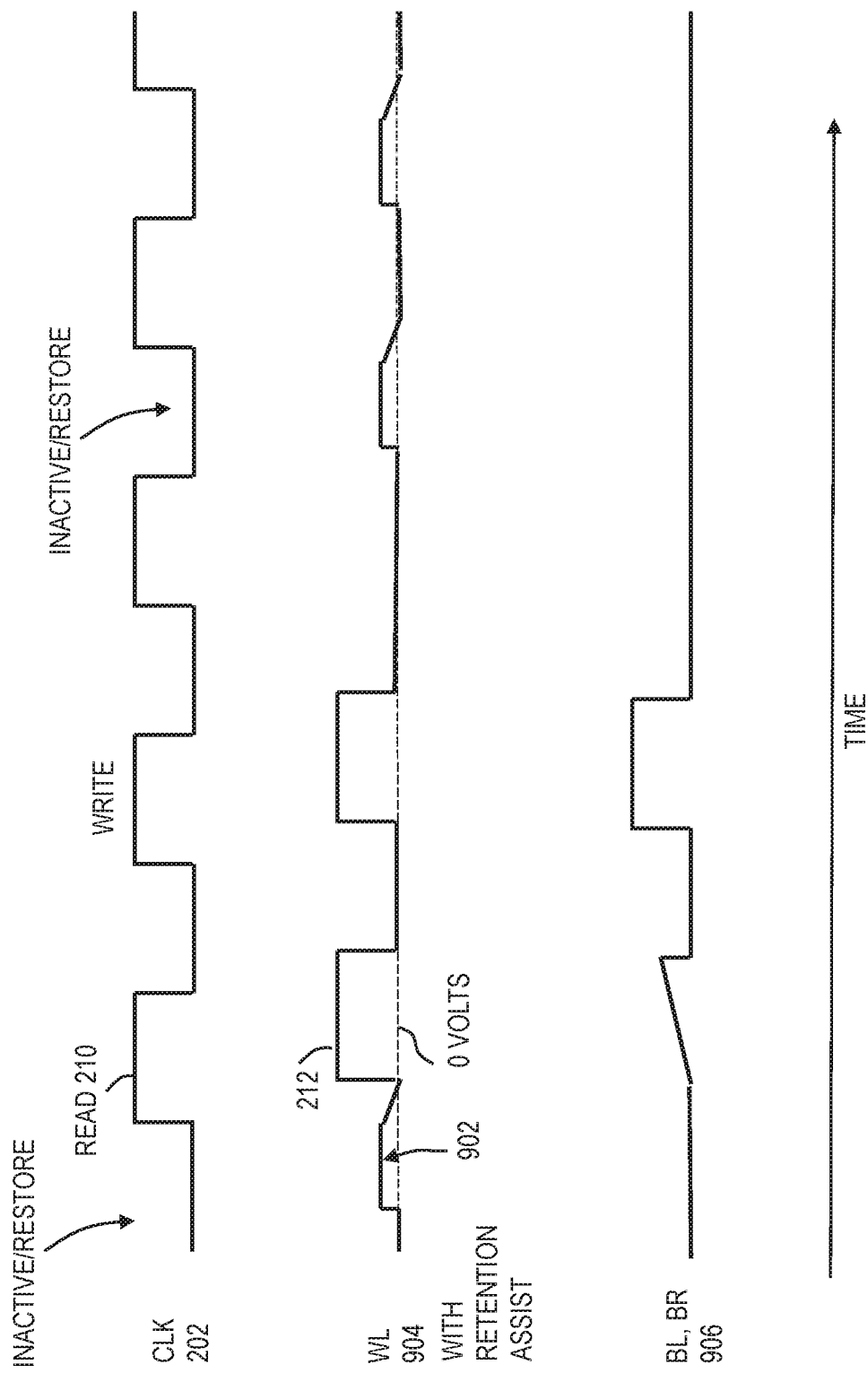

1202 GENERATE A SELECTION FROM THE GROUP CONSISTING OF NEGATIVE RETENTION PULSES ON A BITLINE AND POSITIVE RETENTION PULSES ON A WORD LINE, WHEREIN THE BITLINE AND THE WORD LINE ARE COUPLED TO A 4 TRANSISTOR STATIC RANDOM ACCESS MEMORY (SRAM) BITCELL

1204 CAUSE A VOLTAGE AT AN OUTPUT NODE OF THE 4T SRAM BITCELL TO DECREASE ACCORDING TO THE GENERATING OF THE SELECTION FROM THE GROUP CONSISTING OF THE NEGATIVE RETENTION PULSES AND THE POSITIVE RETENTION PULSES

US 10,614,877 B1

4T STATIC RANDOM ACCESS MEMORY BITCELL RETENTION

BACKGROUND

The present invention generally relates to integrated circuit memory devices, and more specifically, to improvements to 4 transistor (4T) static random access memory (SRAM) bitcell retention.

Memory devices are commonly employed as internal storage areas in a computer or other electronic equipment. One specific type of memory used to store data in a computer is random access memory (RAM). RAM is typically used as main memory in a computer environment and is generally volatile in that once power is turned off, all data stored in the RAM is lost.

An SRAM is one example of a RAM. An SRAM has the advantage of holding data without a need for refreshing. A typical SRAM device includes an array of individual SRAM cells or bitcells. Each SRAM cell is capable of storing a binary voltage value that represents a logical data bit (e.g., "0" or "1"). One existing configuration for an SRAM cell includes a pair of cross-coupled devices such as inverters. The inverters act as a latch that stores the data bit therein as long as power is supplied to the memory array. In a conventional six-transistor (6T) cell, a pair of access transistors or pass gates (when activated by a word line) selectively couples the inverters to a pair of complementary bit lines (i.e., a bit line true and bit line complementary). Other SRAM cell designs can include a different number of transistors (e.g., 4T, 8T, etc.), which can have different advantages and drawbacks.

SUMMARY

Embodiments of the invention are directed to a circuit. A non-limiting example of the circuit includes at least one 4 transistor (4T) static random access memory (SRAM) bitcell, each of the at least one 4T SRAM bitcells including a first PFET, a first NFET, a second PFET, and a second NFET, the first PFET and the first NFET being coupled to form a first output node, and the second PFET and the second NFET being coupled to form a second output node. The circuit includes a pulldown circuit coupled to the first NFET, the pulldown circuit operable to pull down a voltage at the first output node. Also, the circuit includes a feedback circuit operable to monitor the first output node, the feedback circuit operable to control the pulldown circuit.

Embodiments of the invention are directed to a method of configuring a circuit. A non-limiting example of the method includes configuring at least one 4 transistor (4T) static random access memory (SRAM) bitcell, each of the at least one 4T SRAM bitcells comprising a first PFET, a first NFET, a second PFET, and a second NFET, the first PFET and the first NFET being coupled to form a first output node, and the second PFET and the second NFET being coupled to form a second output node. The method includes coupling a pulldown circuit to the first NFET, the pulldown circuit operable to pull down a voltage at the first output node. Also, the method includes providing a feedback circuit operable to monitor the first output node, the feedback circuit operable to control the pulldown circuit.

Embodiments of the invention are directed to a method of operating a circuit. A non-limiting example of the method includes generating a selection from the group consisting of negative retention pulses on a bitline and positive retention pulses on a word line, wherein the bitline and the word line are coupled to a 4 transistor static random access memory (SRAM) bitcell. The method includes causing a voltage at an output node of the 4T SRAM bitcell to decrease according to the generating of the selection from the group consisting of the negative retention pulses and the positive retention pulses.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

FIG. 5 depicts retention assist pulse operation of a SRAM according to embodiments of the invention;

FIG. 6 depicts a schematic of the memory circuit according to embodiments of the invention;

FIG. 7A depicts a diagram of monitoring parameters and adjusting the retention assist pulse rate according to embodiments of the invention;

FIG. 7B depicts a diagram of monitoring a reference bitcell internal node and adjusting the retention assist pulse rate according to embodiments of the invention;

FIG. 9 depicts retention assist pulse operation of a SRAM according to embodiments of the invention;

FIG. 12 depicts a flowchart of a method of operating the memory circuit according to embodiments of the invention.

Figure 1:
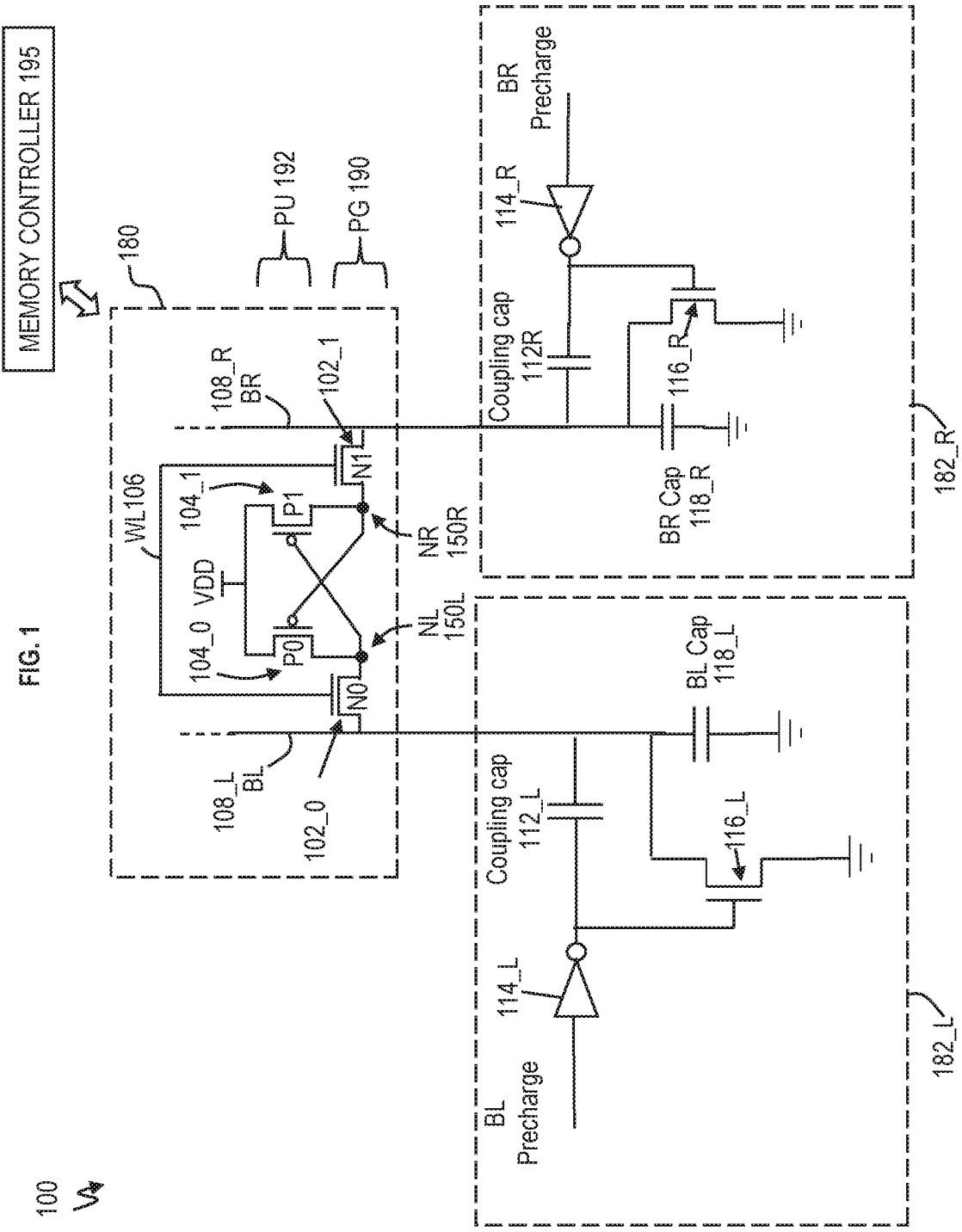
FIG. 1 depicts a schematic of a memory circuit according to embodiments of the invention.

The diagrams depicted herein are illustrative. There can be many variations to the diagram or the operations described therein without departing from the spirit of the invention. For instance, the actions can be performed in a differing order or actions can be added, deleted or modified. Also, the term "coupled" and variations thereof describes having a communications path between two elements and does not imply a direct connection between the elements with no intervening elements/connections between them. All of these variations are considered a part of the specification.

In the accompanying figures and following detailed description of the embodiments of the invention, the various elements illustrated in the figures are provided with two or three digit reference numbers. With minor exceptions, the leftmost digit(s) of each reference number correspond to the figure in which its element is first illustrated.

DETAILED DESCRIPTION

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

Turning now to an overview of technologies that are more specifically relevant to aspects of the invention, the 4-transistor SRAM bitcell is attractive in terms of reduced area compared to the 6-transistor bitcell. However, the 4-transistor SRAM bitcell requires either "refresh" or, because there are fewer transistors that other SRAM configurations, additional elements such as resistors to maintain data retention. Additional resistors are pre-designed into the bitcell or process for 4T SRAM, and it is difficult to modify based on the application environment/condition (i.e., operating temperatures).

Turning now to an overview of the aspects of the invention, one or more embodiments of the invention provide integrated circuit memory devices and methods of operating the integrated circuit memory devices. In the case of 4T SRAM with no "healthy" parasitic ground leak to harvest, embodiments of the invention illustrate that data retention is still possible by raising the 4T SRAM cell Vss, which is defined by the $I_{off}$ (off current) of the pass gate (PG) transistors and the pullup (PU) transistors along with any parasitic ground leakage in the process. This data retention for 4T SRAM occurs under the condition of Vdd-Vss is greater than and/or equal to about 2 times the threshold voltage (Vt) (>2Vt) of the pull up (PU) transistors to ensure that the data is safe. The voltage supply Vdd is the positive voltage or high voltage, while the voltage supply Vss is the ground, low voltage, or 0 voltage. Embodiments of the invention also accommodate Vdd scaling.

Embodiments of the invention provide a retention assist design and method that maintains the 4T SRAM bitcell storage content. Additional circuits are added in 4T SRAM peripheral to assist the bitcell in retaining the stored data. The circuits can be used to pulse bitlines slightly below ground in order to leak current through NFET pass gates (PG) and/or to pulse the word line slightly above ground in order to leak current through the NFET pass gates. For example, the retention assist pulses can occur every 100 nanosecond (ns) and do not interrupt normal operation of the 4T SRAM. The circuits also provide ability to adjust the amount of required retention assist using control logic. The frequency of the retention assist pulses can be adjusted depending on operating process, voltage, and temperature.

Turning now to a more detailed description of aspects of the present invention, FIG. 1 depicts a schematic of a memory circuit 100 according to embodiments of the invention. The memory circuit 100 includes a 4T SRAM bitcell 180. Although a single 4T SRAM bitcell is shown for illustration purposes, it should be appreciated that the memory circuit 100 includes an array of 4T SRAM bitcells coupled in rows via word lines and columns via bitlines. The memory circuit 100 can also be referred to as an SRAM macro as understood by one skilled in the art.

The 4T SRAM bitcell 180 includes two n-type transistors 102_0 and 102_1 and two p-type transistors 104_0 and 104_1. The transistors 102_0 and 102_1 can be n-channel field-effect transistors (NFETs) designated as N0 and N1, respectively. Transistor N0 102_0 and transistor N1 102_1 are pass gates (PG) 190. The transistors 104_0 and 104_1 can be p-channel field-effect transistors (PFETs) designated as P0 and P1, respectively. Transistor P0 104_0 and transistor P1 104_1 are pull up (PU) transistors 192. The drains of the transistors 102_0 and 102_1 are respectively coupled to the drains of transistors 104_0 and 104_1. Also, the drain of transistor N0 102_0 couples to the gate of transistor P1 104_1, while the drain of transistor N1 102_1 couples to the gate of transistor P0 104_0. Left node (NL) 150L is formed at the connection of the drain of transistor N0 102_0, drain of transistor P0 104_0, and gate of transistor P1 104_1. Similarly, right node (NR) is formed at the connection of the drain of transistor N1 102_1, drain of transistor P1 104_1, and gate of transistor P0 104_0. The sources of transistors 104_0 and 104_1 are coupled to voltage supply VDD or VD, which is a voltage source that is positive or a logical high voltage source. The gates of transistors 102_0 and 102_1 are coupled to a word line (WL) 106, and the word line 106 connects to other 4T SRAM bitcells on the same row as understood by one skilled in the art. The sources of transistors 102_0 and 102_1 are coupled to left bitline (BL) 108_L and right bitline (BR) 108_R, respectively. The left and right bitlines 108_L and 108R are coupled to other 4T SRAM bitcells on the same column as understood by one skilled in the art. The left and right bitlines 108_L and 108R are complimentary. The output of the 4T SRAM bitcell 180 is differential and is measured at output nodes NL 150L and NR 150R.

The memory circuit 100 also includes periphery circuits 182_L and 182_R which are coupled to the 4T SRAM bitcell 180. The periphery circuit 182_L couples to bitline BL 108_L and periphery circuit 182_R couples to bitline BR 108_R. The periphery circuit 182_L includes inverter 114_L configured to receive a BL precharge signal, coupling capacitor 112_L, transistor 116_L (e.g., NFET transistor), and left bitline capacitor 118_L. Similarly, the periphery circuit 182_R includes inventor 114_R configured to receive a BR precharge signal, coupling capacitor 112_R, transistor 116_R (e.g., NFET transistor), and right bitline capacitor 118_R.

A memory controller 195 is configured to control the reading and writing of the 4T SRAM bitcell 180 and other 4T SRAM bitcells in the memory circuit 100 as understood by one skilled in the art. The memory controller 195 is configured to couple to the bitlines and word lines to control the 4T SRAM bitcell 180 and other 4T SRAM bitcells in the memory circuit 100 as understood by one skilled in the art.

Figure 2:
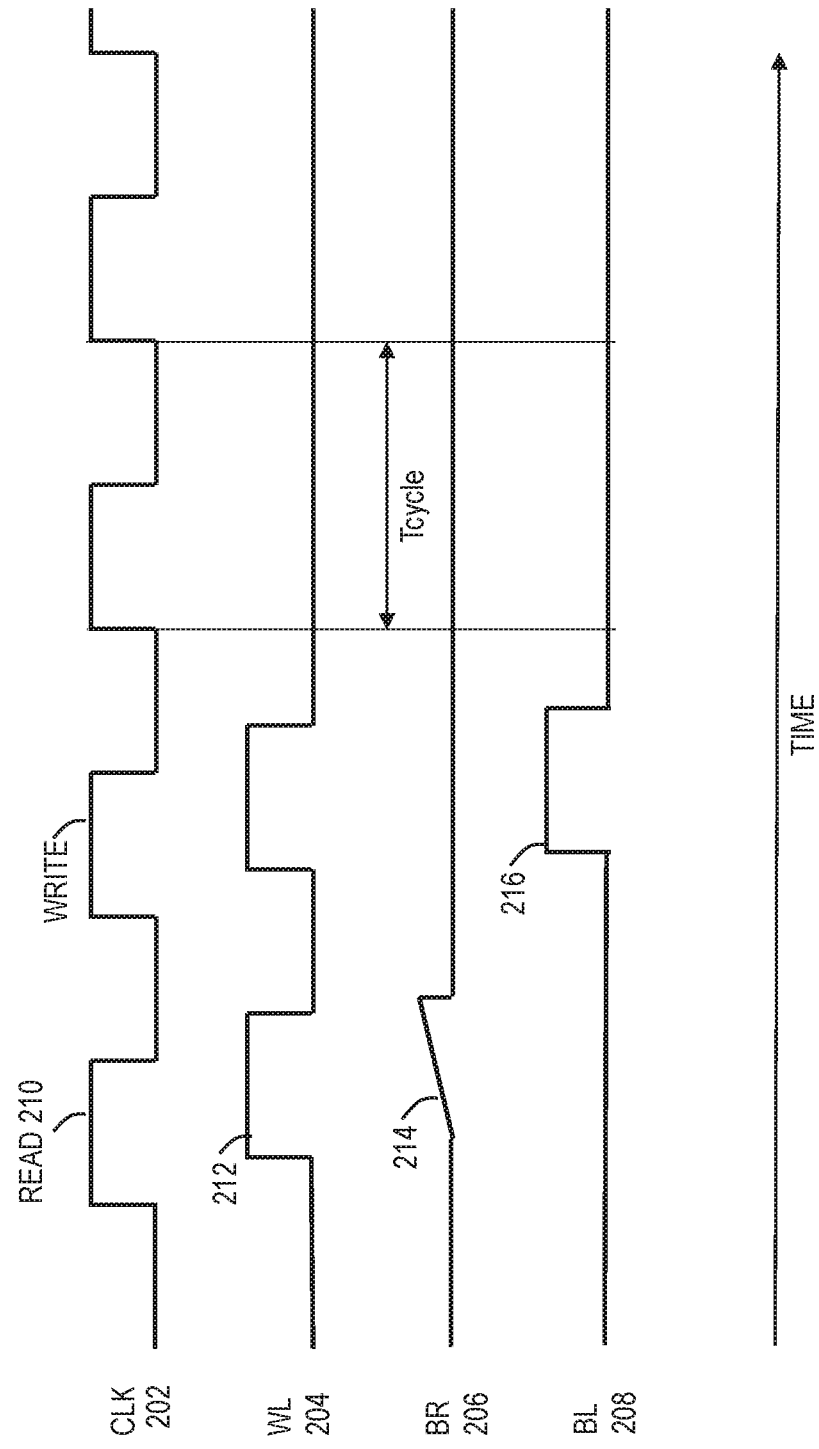
FIG. 2 depicts operation of a general static random access memory (SRAM)

FIG. 2 depicts SRAM operation of a general SRAM. FIG. 2 depicts the clock operation 202, word line operation 204, right bitline operation 206, and the left bitline operation 208. The memory controller 195 causes read pulse 210, and later causes word line pulse 212. A pulse 214 is on the right bitline operation 206 after the word line pulse 212 and pulse 216 is on the left bitline operation. Initially, both the left and right bitlines are at ground (or about 0 volts) prior to the read pulse 210.

Figure 3:
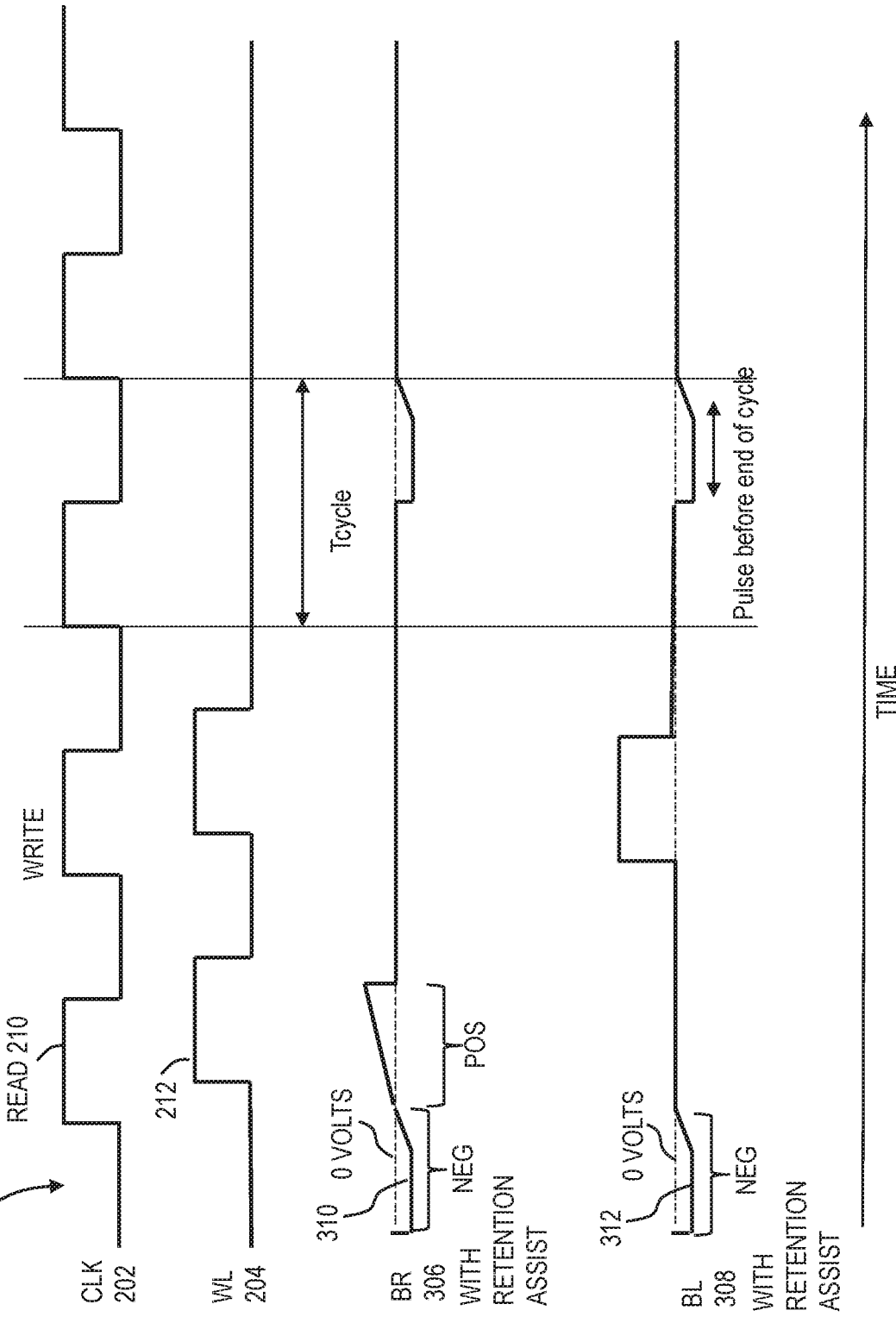
FIG. 3 depicts retention assist pulse operation of a SRAM according to embodiments of the invention.

FIG. 3 depicts SRAM operation of the memory circuit 100 according to embodiments of the invention. FIG. 3 illustrates operation of the memory circuit 100 with a retention assist design that maintains the 4T SRAM bitcell storage content (i.e., data), because (only) 4 transistors are being utilized in the 4T SRAM bitcell. To assist the bitcell in retaining the stored data, the bitlines are pulsed below ground in order to leak current through NFET pass gates (PG).

As discussed above in FIG. 2, FIG. 3 depicts the clock operation 202 and word line operation 204. The memory controller 195 causes read pulse 210, and later causes word line pulse 212. However, prior to the read pulse 210, the retention pulse 310 on right bitline operation 306 and retention pulse 312 on left bitline operation 308 are generated for bitline BR 108_R and bitline BL 108_L, respectively. The retention pulses 310 and 312 occur during the "restore" part or inactive part of the clock cycle. Each of the retention pulses 310 and 312 is a negative voltage pulse, which is a pulse with a negative voltage below 0 volts (i.e., below ground). The negative voltage pulses, retention pulses 310 and 312, precharge bitlines 108_L and 108_R below ground to increase leakage through pass gates 190 (i.e., through N0 102_0 and N1 102_1) when bitlines are normally low. Active clock (system or slower retention clock) is utilized for synchronization. The SRAM operation is synchronized to the system clock. For example, a READ operation starts at the rising edge of the system clock. As noted above, the retention pulses 310 and 312 occur during the "restore" part of the cycle which is after the bitcell access time and before the rising clock edge for next cycle which can be a write pulse or read pulse from the memory controller 195. An example of a cycle is illustrated as $T_{cycle}$ in FIG. 3. The negative retention pulses 310 and 312 do not disrupt normal operations, such as read and write operations by the memory controller 195. The retention assist pulse 312 on bitline BL 108_L causes the left node NL 150L to be less than ground, i.e., at a negative voltage. Similarly, the retention assist pulse 310 on bitline BR 108_R causes the right node NR 150R to be less than ground, i.e., at a negative voltage. Without the retention assist pulse 312, the left node NL 150L would be a floating voltage and could therefore change (i.e., increase to a value greater than ground). Analogously, without the retention assist pulse 310, the right node NR 150R would be a floating voltage and could therefore change (i.e., increase to a value greater than ground).

However, retention assist pulse 312 pulls the source of transistor N0 102_0 (i.e., pulls left bitline BL 108_L) below 0 volts when the transistor N0 is off (i.e., the gate of transistor N0 102_0 is low therefore turning the transistor N0 102_0 off), and the left node NL 150L is pulled to below ground and/or below 0 volts. Current leakage through transistor N0 102_0 is caused by the negative voltage (i.e., retention pulse 312) on left bitline BL 108_L, which in turn causes the left node NL 150L to drop to below ground and/or below 0 volts (i.e., a negative voltage). With the source, 108_L BL, of transistor N0 below ground and the gate voltage of the transistor N0 at 0 volt, the transistor N0 is turned on slightly therefore the drain node, NL 150L, will drop toward the source voltage which is below ground. The right node NR 150R drops to below ground and/or below 0 volts (i.e., a negative voltage) because of the retention pulse 310, for analogous reasons discussed above for left node NL 150L.

Figure 10A:
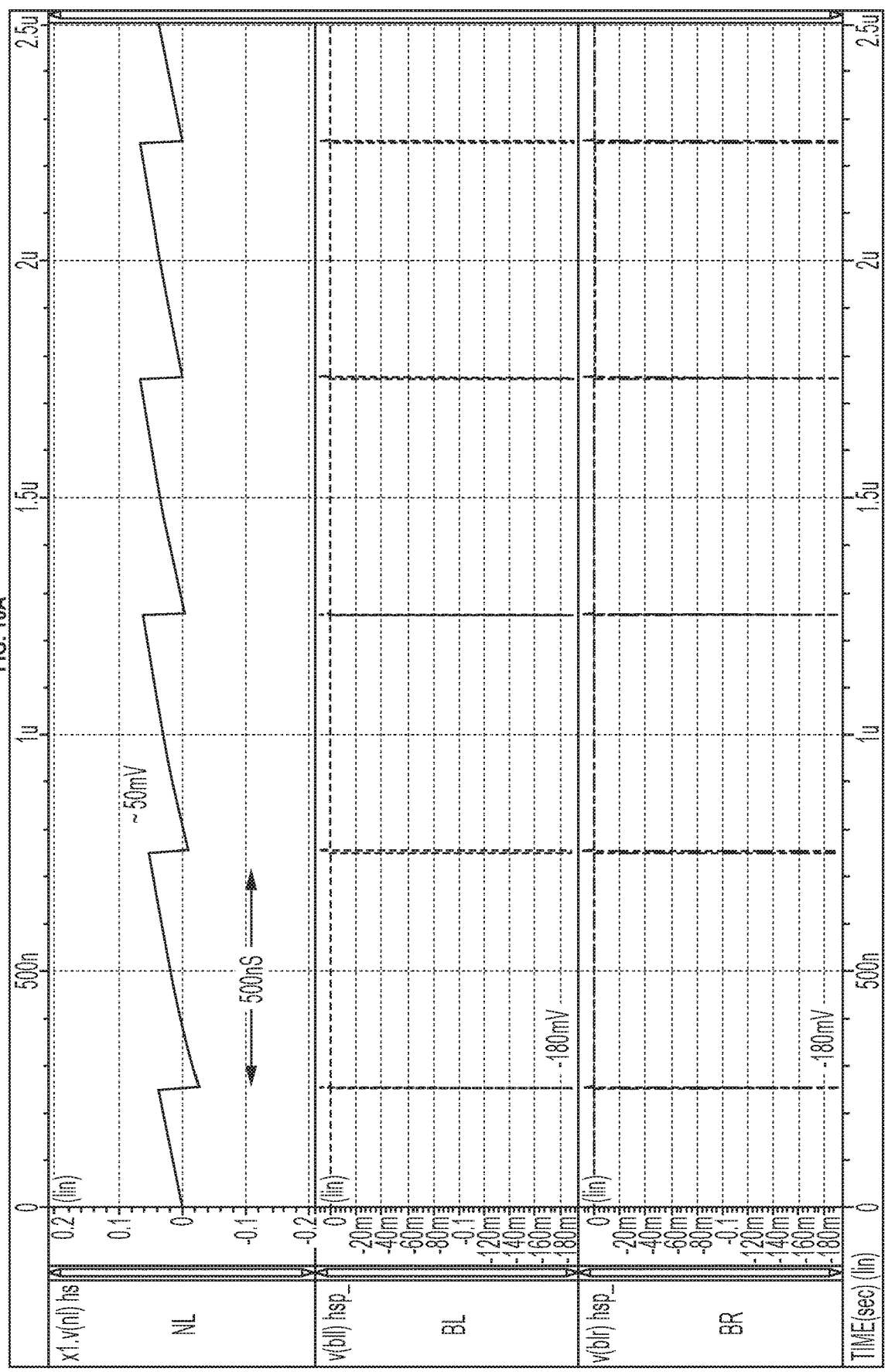
FIG. 10A depicts a graph illustrating retention assist pulse according to embodiments of the invention.
Figure 10B:
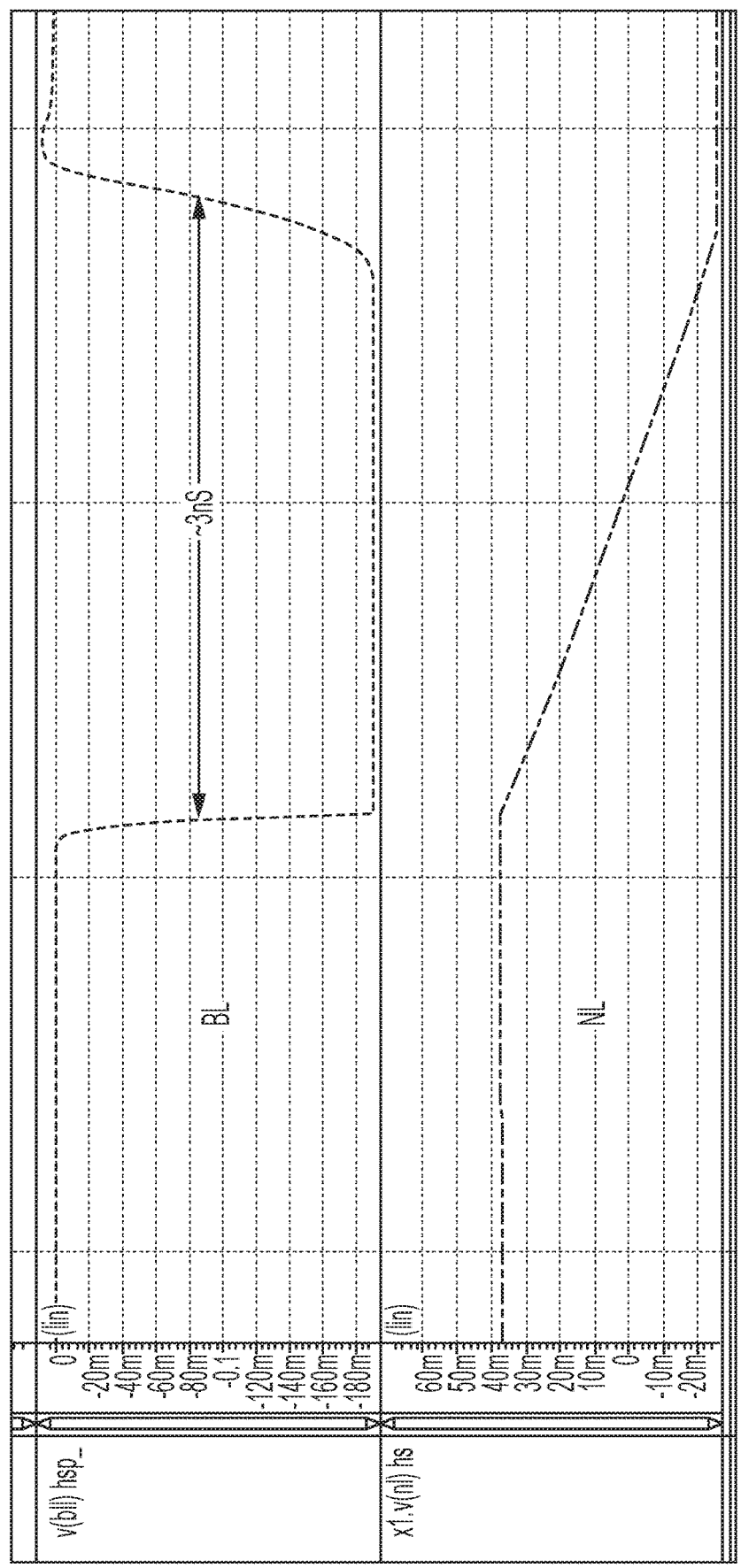
FIG. 10B depicts an enlarged view of a section of the graph in FIG. 10A according to embodiments of the invention.

FIG. 10A depicts a graph illustrating retention assist pulse according to embodiments of the invention. Retention assist pulses are applied to the left bitline BL 108_L and retention assist pulses are applied to right bitline BR 108_R. For both the left and right bitlines BL 108_L and BR 108_R, the retention assist pulse has a value (or coupling voltage) of −180 millivolts (mV) and pulse width of about 3 nanoseconds (ns) (as depicted in FIG. 10B). It should be appreciated that examples are utilized for the voltage and time values. For example, the value of the voltage can be tenths of a volt, and the value of the time can be a few hundred nanoseconds. It is contemplated that the exact values will be optimized based on process technology, application, and operating conditions. The value in the description are examples to help describe the operation for illustrating embodiments of the invention. The retention pulses have a retention assist rate of about 1 pulse every 500 nanoseconds (ns) (i.e., 1/500 ns). As such, the left node NL 150L can be brought down to (a minimum value) below about −20 mV and holds the maximum value to about −50 mV. FIG. 10B depicts an enlarged view of a portion of the graph in FIG. 10A. FIG. 10B illustrates the voltage and time on the left bitline 108_L and resulting voltage on the left node NL 150L. The enlarged view in FIG. 10B shows that the negative pulse width is about 3 ns.

The parameters of the retention assist pulses (e.g., on the bitlines) can be optimized/adjusted as desired. The parameters of the retention assist pulses include pulse width (e.g., 3 ns in FIGS. 10A and 10B), retention assist rate (e.g., 1/500 ns in FIGS. 10A and 10B), and retention assist voltage (e.g., −180 mV). These parameters can be increased as the temperature increases and/or as the voltage increases on the respective output nodes NL and/or NR, as further discussed below.

Figure 4:
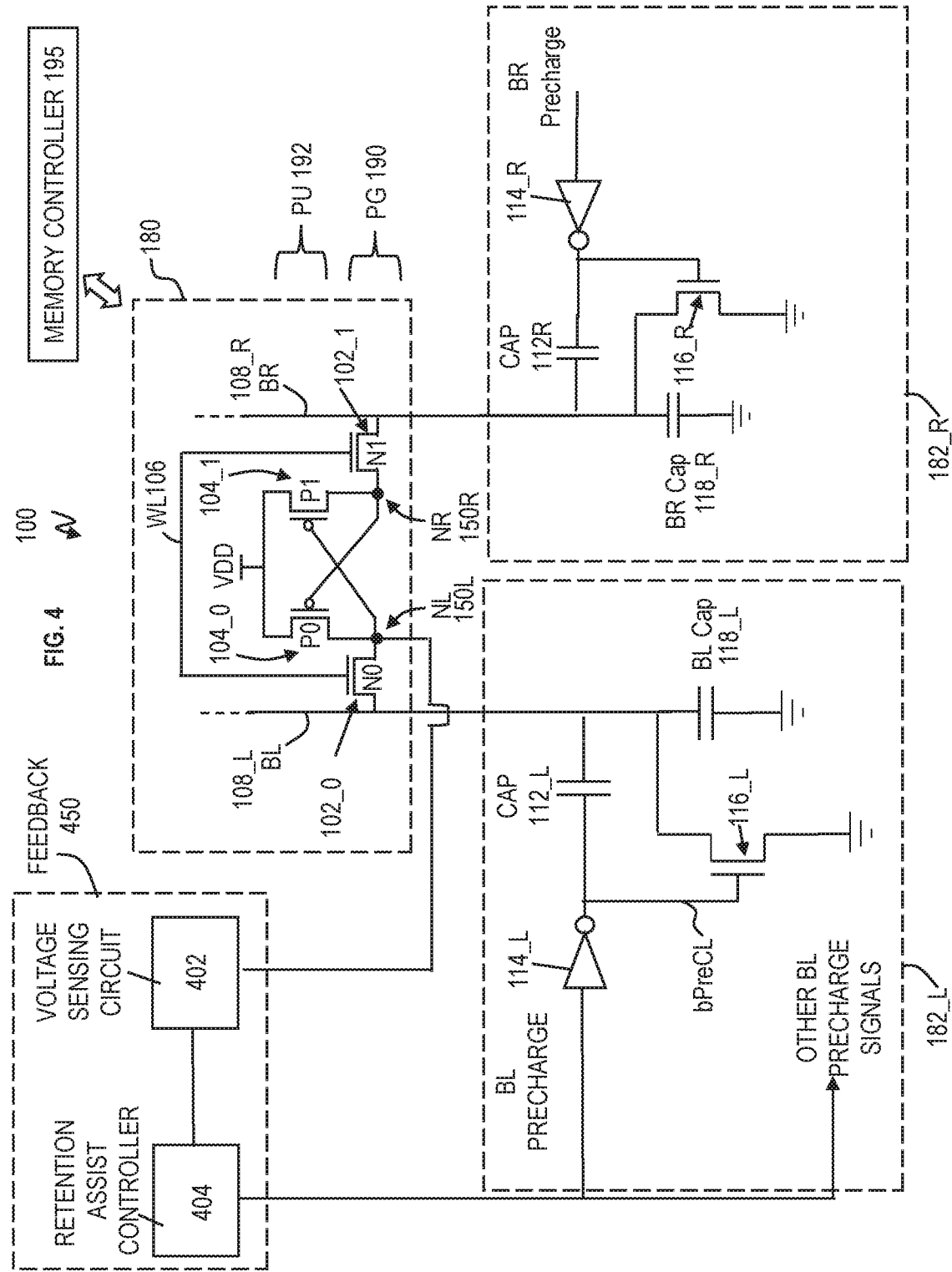
FIG. 4 depicts a schematic of the memory circuit according to embodiments of the invention.
Figure 8:
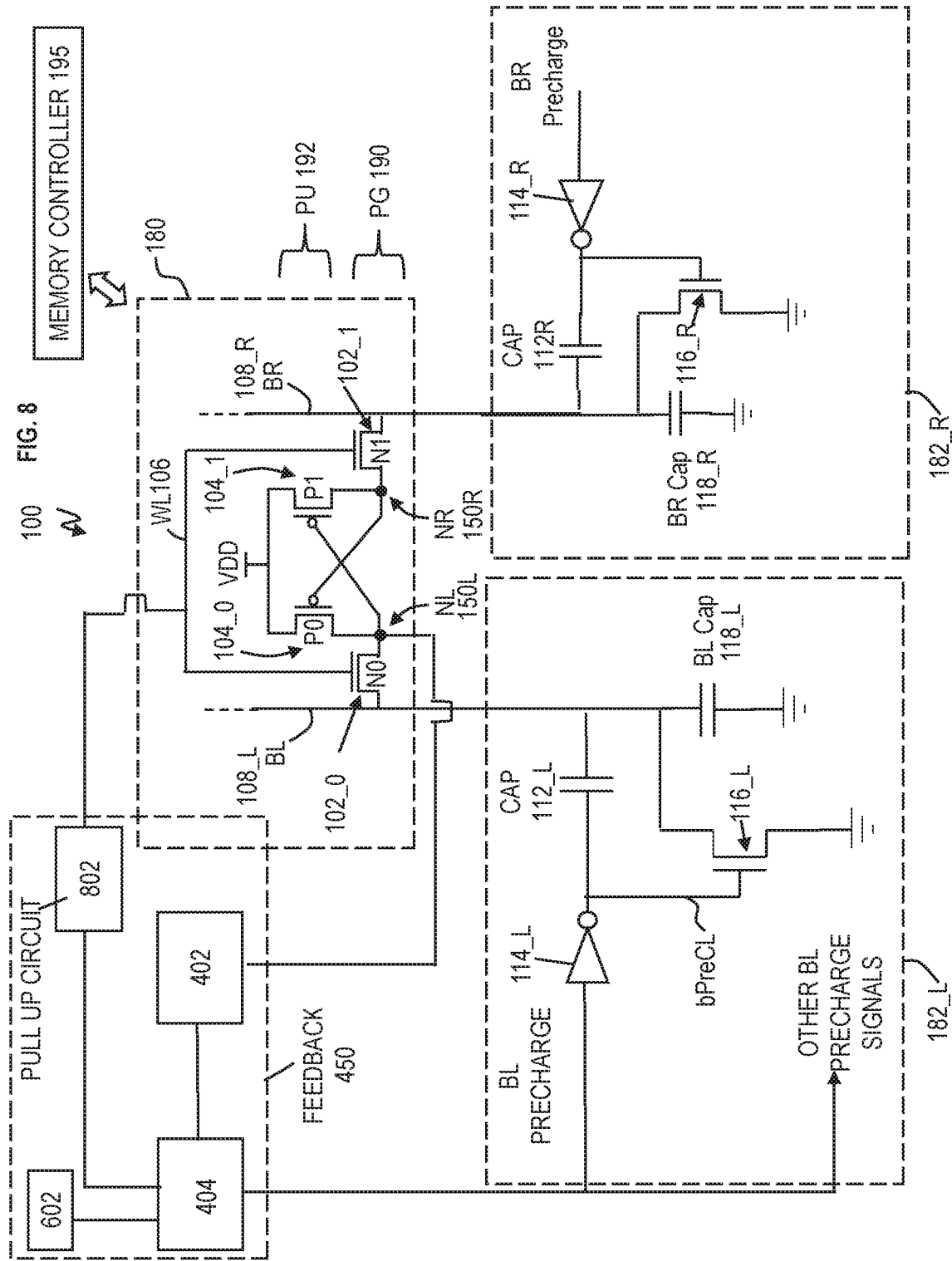
FIG. 8 depicts a schematic of the memory circuit according to embodiments of the invention.

FIG. 4 depicts a schematic of the memory circuit 100 according to embodiments of the invention. FIG. 4 illustrates a voltage sensing circuit 402 configured to measure the value of the voltage at left node 150L, such that the retention assist pulses can be adjusted based on the voltage measured at the left node 150L. A retention assist controller 404 is configured to cause the retention assist pulses on, for example, the left bitline 108_L, the right bitline 108_R, and/or the word line 106 (as depicted in FIG. 8). The retention assist controller 404 is a retention assist pulse width and cycle time/rate controller. The retention assist controller 404 includes and execute control logic to operate as discussed herein. In some embodiments of the invention, the retention assist controller 404 can include one or more processors which execute the control logic. In some embodiments of the invention, the retention assist controller 404 can include logic circuits designed to execute the control logic. The retention assist controller 404 is configured to change the parameters of the retention assist pulse based on the voltage at the left node NL 150L. A feedback circuit 450 includes the retention assist controller 404 and voltage sensing circuit 402. In some embodiments of the invention, the retention assist controller 404 can be implemented and/or integrated in the memory controller 195.

Although the voltage sensing circuit 402 is coupled to the left node NL 150L and the retention assist controller 404 is coupled to the left bitline 108_L via circuit 182_L, it should be analogously appreciated that the voltage sensing circuit 402 can be coupled to the right node NR 150R and the retention assist controller 404 can be coupled to the right bitline 108_R via circuit 182_R.

FIG. 5 depicts example pulses as controlled by the retention assist controller 404 according to embodiments of the invention. The retention assist controller 404 is configured to send a BL precharge pulse to inverter 114_L and the inverter 114_L outputs a high pulse on bPreCL, i.e., on the gate of transistor 116_L. Accordingly, the high pulse on the gate of transistor 116_L turns on transistor 116_L, which then pulls the left bitline BL 108_L down to ground or below ground (below 0 volts). As a result, left node NL 150L is brought down to below ground (below 0 volts).

As an example of operating the memory circuit 100, initialization occurs. During initialization, the retention assist controller 404 is configured to start the retention assist pulse with a pulse with of about 30 ns to bring the floating node voltage, left node 150L, down from about 450 mV to ground (or below 0). The initial retention assist rate can start off at 1 pulse every 500 ns. The retention assist controller 404 is configured to monitor the voltage of NL 150L via voltage sensor 402 and temperature on the memory circuit 100 via temperature sensor 602 in FIG. 6, along with other leakage parameters, and retention assist controller 404 is configured to adjust the retention pulse assist rate and retention pulse assist width accordingly. For example, the temperature increases the leakage increases on, for example, transistor P0 104_0 which pulls up the voltage of left node NL 150L. Accordingly, the retention assist controller 404 is configured to increase the retention assist rate (results in a decrease in the time/spacing between retention pulses, e.g., from 1 pulse every 500 ns to 2 or 3 pulses every 500 ns) thereby having more retention pulses and is configured to increase the retention pulse assist width (e.g., change from 3 ns to 10 ns or 30 ns). In FIG. 6, the temperature sensor 602 is configured to monitor the temperature of the memory circuit 100. Voltage sensing circuit 604 is configured to monitor the voltage of power supply voltage (VDD). The voltage sensor 604 is operatively connected to the power supply voltage (VDD) although not shown for conciseness and connected to the retention assist controller 404. An increase in the (positive polarity of) voltage of the power supply (VDD) increases the voltage at left node NL 150L. Therefore, the retention assist controller 404 is configured to increase retention assist pulses to counter the increase in voltage at VDD. Furthermore, as the temperature increases and/or the voltage VDD increases, the retention assist controller 404 is configured to adjust the retention assist pulses accordingly as depicted in the diagram of FIG. 7A. The memory circuit 100 can include numerous 4T SRAM bitcells 180 which together form a 4T SRAM macro 702 as understood by one skilled in the art. As depicted in FIG. 7A, the retention assist controller 404 is configured to control the retention assist pulses for each of the 4T SRAM bitcells 180 in the 4T SRAM macro 702 such that the retention assistance rate increases as a function of temperature (measured by temperature sensor 602) to compensate for the higher leakage (e.g., via P0 104_0) at elevated temperatures and/or increases as a function of VDD voltage (measured by voltage sensor 604) to compensate for the higher power supply voltage (VDD). This higher current leakage through transistor P0 104_0 pulls up the voltage at left node NL 150L and/or this higher VDD voltage at the source of transistor P0 104_0 pulls up the voltage at left node NL 150L. Therefore, to compensate for this (positive) increase in the value of the voltage at left node NL 150L the retention assist pulses of the pull down voltage need to occur more frequently. Additionally or alternatively, the pulse width of the retention assist pulses can be increased. Running the memory circuit 100 and other circuits in, for example, a computer cause an increase in temperature which is compensated for as discussed herein.

FIG. 7B depicts a diagram of monitoring a reference bitcell internal node and adjusting the retention rate to limit the floating node voltage according to embodiments of the invention. The retention assist controller 404 can monitor each 4T SRAM bitcell 180 on the 4T SRAM macro 702, a group of 4T SRAM bitcells 180 on the 4T SRAM macro 702, and/or a designated reference 4T SRAM bitcell 180 on the 4T SRAM macro 702. FIG. 7B illustrates an example in which the reference 4T SRAM bitcell 180 is monitored, and based on the floating node voltage measured at left node NL 150L of the reference 4T SRAM bitcell 180, the retention assist controller 404 is configured to modify the retention assist pulses for all of the 4T SRAM bitcells 180 on the 4T SRAM macro 702. The floating node voltage measured at node NL 150L for reference 4T SRAM bitcell 180 is taken as the representation for the other 4T SRAM bitcells 180 that were not measured on the 4T SRAM macro 702.

FIG. 8 depicts a schematic of the memory circuit 100 according to embodiments of the invention. FIG. 8 shows a pull up circuit 802 coupled to the word line 106. The pull up circuit can be one or more transistors coupled to a voltage source so as to be connectable to the word line 106, thereby pulling up the voltage on the word line 106 (along with pulling up the gates of pass gates 190). For example, the retention assist controller 404 is configured to cause the pull up circuit 802 to output positive retention assist pulses on the word line 106. These positive retention assist pulses can be slightly above ground and cause current to leak through the pass gates 190 (i.e., transistors N0 102_0 and N1 102_1). This results in the node NL 150L being pulled down to ground. For example, left bitline 108_L is held at 0 V, since the gate voltage (WL 106) of N0 is at positive voltage, and transistor N0 is slightly turned on conducting current between source and drain; therefore, the drain node NL 150L will be discharged toward 0 V. It is again noted that the retention assist pulses do not occur during the normal operation of the memory circuit 100, which means the retention assist pules (whether on the bitlines and/or the word lines) do not occur during the read pulses or the write pulses.

FIG. 9 depicts SRAM operation of the memory circuit 100 according to embodiments of the invention. FIG. 9 illustrates the clock operation 202 and word line operation 904. The memory controller 195 causes read pulse 210 and subsequently causes word line pulse 212. However, prior to the word line pulse 212 on the word line 106, the retention assist controller 404 is configured to send the retention assist pulse 902 on the word line 106. The start of the retention assist pulse 902 is before the read pulse 210. The retention assist pulse 902 on the word line 106 is just a few millivolts such that its magnitude is less than half the magnitude of the word line pulse 212. The word line pulse 212 is used in conjunction with a read pulse or write pulse. Unlike the negative retention pulses on bitlines, the retention assist pulses on the word line 105 are positive or a positive polarity (i.e., positive voltage). As discussed above, parameters of the positive retention pulses on the word line 106 can be adjusted by the retention assist controller 404 according to monitored temperature (via temperature sensor 602) and monitored voltage at left node NL 150L (via voltage sensing circuit 402).

As noted above, the retention pulses 902 start during the "restore" part of the cycle which is after the bitcell access time and before the rising clock edge for next cycle. The positive retention pulses 902 do not disrupt normal operations, such as read and write operations. The retention assist pulse 902 causes the left node NL 150L to be less than ground, i.e., at a negative voltage. Without the retention assist pulse 902, the left node NL 150L would be a floating voltage and could therefore change (i.e., increase to a value greater than ground). The bitline operation 906 can be normal in FIG. 9. In some embodiments of the invention, the bitline operation for the bitlines BL 108_L and BR 108_R can have negative retention assist pulses as discussed herein concurrently with the positive retention pulses on the word line 106. As such, the positive retention pulses on the word line 106 and negative retention pulses on the bitlines BL 108_L and BR 108_R work together to bring the voltage at node NL 150L to ground (0 volts) and/or below ground (below 0 volts).

It should be noted that the retention assist controller 404 is configured to disable or stop the retention assist pulses in case when the monitoring parameters are such that no retention is required. For example, the temperature can remain below a predefined threshold, the VDD power supply voltage could remain below a predefined threshold, and/or the voltage at left node 150L could remain below a predefined threshold such that the retention assist controller 404 determines that no retention assist is required.

Figure 11:
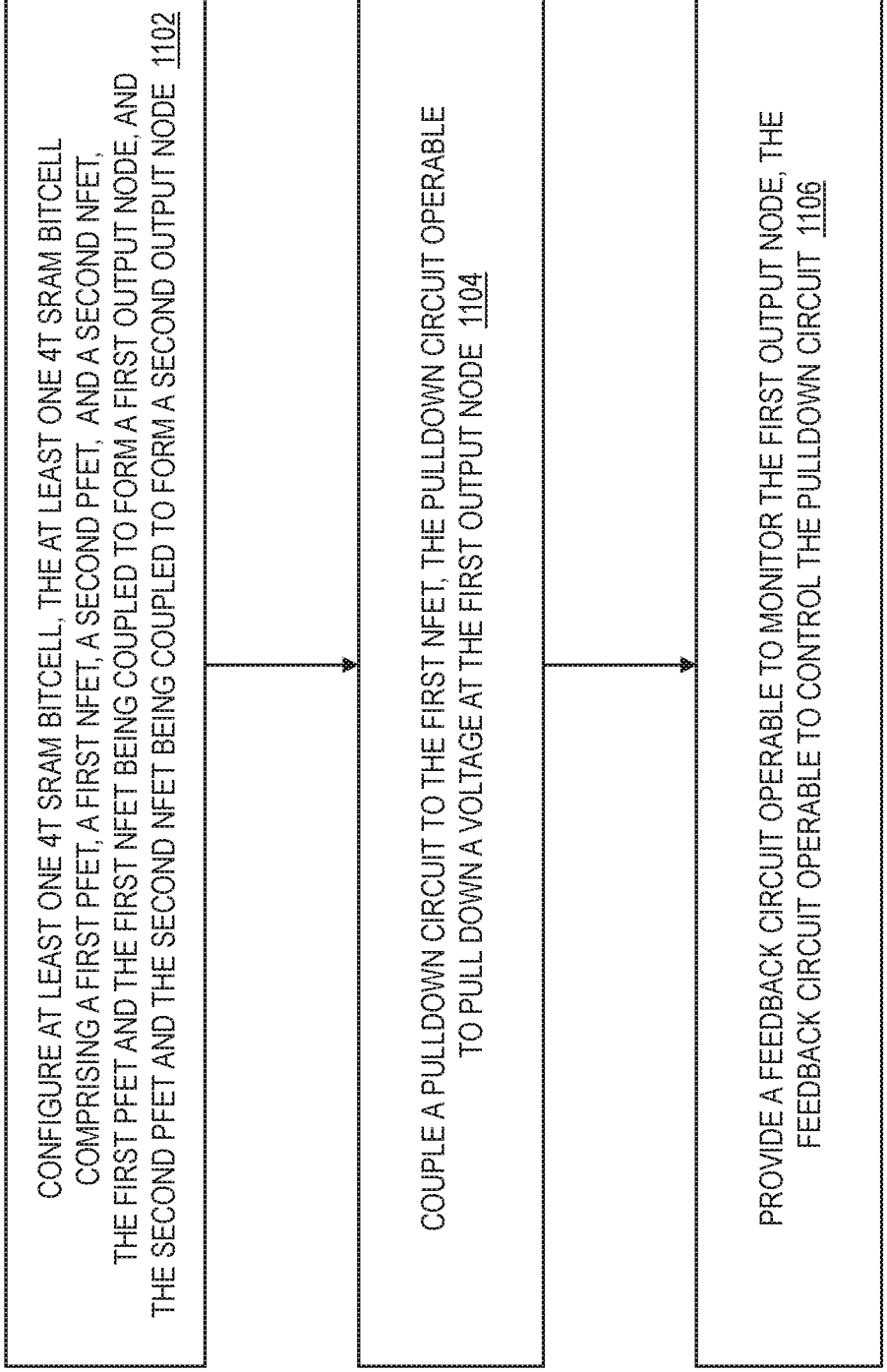
FIG. 11 depicts a flowchart of a method of configuring the memory circuit according to embodiments of the invention.

FIG. 11 depicts a flowchart 1100 of a method of configuring a memory circuit 100 according to embodiments of the invention. At block 1102, the method includes configuring at least one 4 transistor static random access memory (SRAM) bitcell 180, the at least one 4T SRAM bitcell 180 including a first PFET (e.g., P0 104_0), a first NFET (e.g., N0 102_0), a second PFET (e.g., P1 104_1), and a second NFET (e.g., N1 102_1), the first PFET and the first NFET being coupled to form a first output node NL 150L, and the second PFET and the second NFET being coupled to form a second output node NR 150R. At block 1104, the method includes coupling a pulldown circuit 182_L to the first NFET 102_0, the pulldown circuit 182_L being operable to pull down a voltage at the first output node NL 150L. At block 1106, the method includes providing a feedback circuit 450 operable to monitor the first output node NL 150L, the feedback circuit 450 being operable to control the pulldown circuit 182_L (as well as the pulldown circuit 182_R).

A first bitline BL 108_L is coupled to the first NFET N0 102_0 and a second bitline BR 108_R coupled to the second NFET N1 102_1. The feedback circuit 450 is operable to cause the pulldown circuit 182_L to pull down the first bitline BL 108_L to below ground, and the feedback circuit 450 is operable to cause the pulldown circuit 182_L to pull down the first bitline BL 108_L to below ground. The feedback circuit 450 includes a controller 404, the controller 404 being operable to pull down the voltage at the first output node NL 150L. The feedback circuit 450 includes or is coupled to a temperature sensor 602, the feedback circuit 450 being operable to control the pulldown circuit 182_L according to a temperature measured by the temperature sensor 602. The feedback circuit 450 includes or is coupled to a voltage sensing circuit 402 configured to measure the voltage at the first output node NL 150L, the feedback circuit 450 being operable to control the pulldown circuit 182_L according to the voltage measured at the first output node NL 150L.

A word line 106 is coupled to the first NFET N0 102_0 and the second NFET NO 102_1. A pullup circuit 802 is coupled to the word line 106, the pullup circuit 802 being operable to cause a decrease in the voltage at the first output node NL 150L. The feedback circuit 450 includes a voltage sensing circuit 604 configured to measure a power supply voltage at sources of the first PFET 104_0 and the second PFET 104_1, the feedback circuit 450 operable to control the pulldown circuit according to the power supply voltage (VDD) measured by the voltage sensing circuit 604.

FIG. 12 depicts a flowchart 1200 of a method of operating a circuit 100 according to embodiments of the invention. At block 1202, the method includes generating a selection from the group consisting of negative retention pulses on a bitline 108_L and positive retention pulses on a word line 106, where the bitline 108_L and the word line 106 are coupled to a 4 transistor static random access memory (SRAM) bitcell 180. At block 1204, the method includes causing a voltage at an output node NL 150L of the 4T SRAM bitcell 180 to decrease according to the generating of the selection from the group consisting of the negative retention pulses and the positive retention pulses.

The voltage at the output node NL 150L decreases to a value selected from the group consisting of ground and below ground. The feedback circuit 450 is configured to monitor a selection from the group consisting of the voltage at the output node and a temperature on the circuit 100. As such, the feedback circuit 450 is configured to adjust parameters associated with the group consisting of the negative retention pulses on the bitline BL 108_L and the positive retention pulses on the word line 106, wherein the adjusting of the parameters maintains the voltage at the output node at a value selected from the group consisting of ground and below ground.

Various embodiments of the present invention are described herein with reference to the related drawings. Alternative embodiments can be devised without departing from the scope of this invention. Although various connections and positional relationships (e.g., over, below, adjacent, etc.) are set forth between elements in the following description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements.

The phrase "selective to," such as, for example, "a first element selective to a second element," means that the first element can be etched and the second element can act as an etch stop.

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

As previously noted herein, for the sake of brevity, conventional techniques related to semiconductor device and integrated circuit (IC) fabrication may or may not be described in detail herein. By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), and chemical-mechanical planarization (CMP), and the like. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

The flowchart and block diagrams in the Figures illustrate possible implementations of fabrication and/or operation methods according to various embodiments of the present invention. Various functions/operations of the method are represented in the flow diagram by blocks. In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A circuit comprising:
    at least one 4 transistor (4T) static random access memory (SRAM) bitcell, each of the at least one 4T SRAM bitcells comprising a first PFET, a first NFET, a second PFET, and a second NFET, the first PFET and the first NFET being coupled to form a first output node, and the second PFET and the second NFET being coupled to form a second output node;
    a pulldown circuit coupled to the first NFET, the pulldown circuit operable to pull down a voltage at the first output node; and
    a feedback circuit operable to monitor the first output node, the feedback circuit operable to control the pulldown circuit.
2. The circuit of claim 1 further comprising a first bitline coupled to the first NFET and a second bitline coupled to the second NFET.

3. The circuit of claim 2, wherein the feedback circuit is operable to cause the pulldown circuit to pull down the first bitline to below ground.

4. The circuit of claim 1, wherein the feedback circuit comprises a voltage sensing circuit configured to measure a power supply voltage at sources of the first PFET and the second PFET, the feedback circuit operable to control the pulldown circuit according to the power supply voltage measured by the voltage sensing circuit.

5. The circuit of claim 1, wherein the feedback circuit comprises a controller, the controller operable to pull down the voltage at the first output node.

6. The circuit of claim 1, wherein the feedback circuit comprises a temperature sensor, the feedback circuit operable to control the pulldown circuit according to a temperature measured by the temperature sensor.

7. The circuit of claim 1, wherein the feedback circuit comprises a voltage sensing circuit configured to measure the voltage at the first output node.

8. The circuit of claim 7, wherein the feedback circuit is operable to control the pulldown circuit according to the voltage measured at the first output node.

9. The circuit of claim 1 further comprising:
a word line coupled to the first NFET and the second NFET; and
a pullup circuit coupled to the word line.

10. The circuit of claim 9, wherein the pullup circuit is operable to cause a decrease in the voltage at the first output node.

11. A method of configuring a circuit, the method comprising:
configuring at least one 4 transistor (4T) static random access memory (SRAM) bitcell, each of the at least one 4T SRAM bitcells comprising a first PFET, a first NFET, a second PFET, and a second NFET, the first PFET and the first NFET being coupled to form a first output node, and the second PFET and the second NFET being coupled to form a second output node;
coupling a pulldown circuit to the first NFET, the pulldown circuit operable to pull down a voltage at the first output node; and
providing a feedback circuit operable to monitor the first output node, the feedback circuit operable to control the pulldown circuit.

12. The method of claim 11, wherein a first bitline is coupled to the first NFET and a second bitline coupled to the second NFET.

13. The method of claim 12, wherein:
the feedback circuit is operable to cause the pulldown circuit to pull down the first bitline to below ground; and
the feedback circuit is operable to cause the pulldown circuit to pull down the first bitline to about ground.

14. The method of claim 11, wherein the feedback circuit comprises a controller, the controller operable to pull down the voltage at the first output node.

15. The method of claim 11, wherein:
the feedback circuit comprises a temperature sensor, the feedback circuit operable to control the pulldown circuit according to a temperature measured by the temperature sensor; and
the feedback circuit comprises a voltage sensing circuit configured to measure the voltage at the first output node, the feedback circuit being operable to control the pulldown circuit according to the voltage measured at the first output node.

16. The method of claim 11, wherein:
a word line is coupled to the first NFET and the second NFET; and
a pullup circuit coupled to the word line, the pullup circuit being operable to cause a decrease in the voltage at the first output node.

17. A method of operating a circuit, the method comprising:
generating a selection from the group consisting of negative retention pulses on a bitline and positive retention pulses on a word line, wherein the bitline and the word line are coupled to a 4 transistor static random access memory (SRAM) bitcell; and
causing a voltage at an output node of the 4T SRAM bitcell to decrease according to the generating of the selection from the group consisting of the negative retention pulses and the positive retention pulses.

18. The method of claim 17, wherein the voltage at the output node decreases to a value selected from the group consisting of ground and below ground.

19. The method of claim 17 further comprising:
monitoring a selection from the group consisting of the voltage at the output node and a temperature on the circuit; and
adjusting parameters associated with the group consisting of the negative retention pulses and the positive retention pulses, wherein the adjusting of the parameters maintains the voltage at the output node at a value selected from the group consisting of ground and below ground.

20. The method of claim 17, wherein the 4T SRAM bitcell comprises a first PFET, a first NFET, a second PFET, and a second NFET, the first PFET and the first NFET being coupled to form the output node.

* * * * *